US009705079B2

(12) United States Patent
Bajaj et al.

(10) Patent No.: US 9,705,079 B2
(45) Date of Patent: Jul. 11, 2017

(54) TUNABLE VOLTAGE MARGIN ACCESS DIODES

(71) Applicant: INTERNATIONAL BUSINESS MACHINES CORPORATION, Armonk, NY (US)

(72) Inventors: Mohit Bajaj, Bangalore (IN); Arpan K. Deb, Uttar Pradesh (IN); Aniruddha Konar, Bangalore (IN); Kota V. R. M. Murali, Bangalore (IN); Rajan K. Pandey, Bangalore (IN); Kumar R. Virwani, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/343,602

(22) Filed: Nov. 4, 2016

(65) Prior Publication Data

US 2017/0047515 A1 Feb. 16, 2017

Related U.S. Application Data

(63) Continuation of application No. 15/132,675, filed on Apr. 19, 2016, now Pat. No. 9,508,930, which is a (Continued)

(51) Int. Cl.

*H01L 29/24* (2006.01)
*H01L 29/16* (2006.01)
(Continued)

(52) U.S. Cl.

CPC ...... *H01L 45/1666* (2013.01); *H01L 21/0262* (2013.01); *H01L 21/02568* (2013.01); (Continued)

(58) Field of Classification Search

CPC ... H01L 45/1608; H01L 45/165; H01L 45/16; H01L 45/1666; H01L 45/1226; (Continued)

(56) References Cited

U.S. PATENT DOCUMENTS 6,914,225 B2 7/2005 Fischer et al.
8,105,928 B2 1/2012 Lin et al.
(Continued)

FOREIGN PATENT DOCUMENTS

WO 2011047393 A1 4/2011

OTHER PUBLICATIONS

Gopalakrishnan et al., "Highly-Scalable Novel Access Device based on Mixed Ionic Electronic Conduction (MIEC) Materials for High Density Phase Change Memory (PCM) Arrays", 2010 Symposium on VLSI Technology Digest of Technical Papers, 2010 IEEE, pp. 205-206.

(Continued)

*Primary Examiner* — Dao H Nguyen
(74) *Attorney, Agent, or Firm* — L. Jeffrey Kelly

(57) ABSTRACT

The present invention relates generally to high current density access devices (ADs), and more particularly, to a structure and method of forming tunable voltage margin access diodes in phase change memory (PCM) blocks using layers of copper-containing mixed ionic-electronic conduction (MIEC) materials. Embodiments of the present invention may use layers MIEC material to form an access device that can supply high current-densities and operate reliably while being fabricated at temperatures that are compatible with standard BEOL processing. By varying the deposition technique and amount of MIEC material used, the voltage margin (i.e. the voltage at which the device turns on and the
(Continued)

100

304

302

302

202

102 current is above the noise floor) of the access device may be tuned to specific operating conditions of different memory devices.

1 Claim, 4 Drawing Sheets

Related U.S. Application Data continuation of application No. 14/665,261, filed on Mar. 23, 2015.

(51) Int. Cl.
*H01L 45/00* (2006.01)
*H01L 27/24* (2006.01)
*H01L 27/22* (2006.01)
*H01L 29/861* (2006.01)
*H01L 21/02* (2006.01)
*H01L 29/66* (2006.01)
*H01L 29/15* (2006.01)

(52) U.S. Cl.
CPC ........ *H01L 27/224* (2013.01); *H01L 27/2409* (2013.01); *H01L 29/157* (2013.01); *H01L 29/24* (2013.01); *H01L 29/66121* (2013.01); *H01L 29/8618* (2013.01); *H01L 45/08* (2013.01); *H01L 45/085* (2013.01); *H01L 45/1226* (2013.01); *H01L 45/1233* (2013.01); *H01L 45/1253* (2013.01); *H01L 45/165* (2013.01); *H01L 45/1608* (2013.01)

(58) Field of Classification Search
CPC . H01L 45/1253; H01L 45/142; H01L 45/085; H01L 45/1233; H01L 45/08; H01L 29/8618; H01L 29/66121; H01L 29/157; H01L 27/24; H01L 27/224; H01L 27/2409; H01L 31/1129; H01L 21/0262; H01L 21/02568
USPC .......... 257/22, 9, 19, 86, 290, 347, E29.168, 257/E29.296, E33.013, E31.026, E21.411, 257/E21.499; 438/95, 382, 539
See application file for complete search history.

(56) References Cited

U.S. PATENT DOCUMENTS 8,455,861 B2 6/2013 Lin et al.
9,147,824 B1 9/2015 Cao et al.
2011/0227023 A1 9/2011 Bethune et al.
2013/0044532 A1 2/2013 Bethune et al.
2013/0105824 A1 5/2013 Paranjape et al.
2015/0060768 A1* 3/2015 Dodabalapur .... H01L 21/02425 257/29
2015/0122315 A1* 5/2015 Shin ........................ H01L 29/73 136/255
2015/0192533 A1 7/2015 Bajaj et al.
2015/0214482 A1* 7/2015 Park ...................... H01L 51/002 257/9
2015/0255661 A1 9/2015 Liang et al.
2015/0294875 A1* 10/2015 Khondaker ....... H01L 21/02175 257/411
2015/0364592 A1 12/2015 van Dal et al.
2016/0240719 A1* 8/2016 Lin ..................... H01L 21/0262
2016/0247927 A1* 8/2016 Nomura .............. H01L 29/7869
2016/0248007 A1* 8/2016 Hersam ............... H01L 27/2463
2016/0265047 A1* 9/2016 van Rooyen ........ G01N 27/414
2016/0284870 A1 9/2016 Bajaj et al.
2016/0284995 A1 9/2016 Bajaj et al.
2016/0300958 A1* 10/2016 Park .................. H01L 29/78681

OTHER PUBLICATIONS

Burr et al., "Phase Change Memory Technology", Journal of Vacuum Science & Technology B28, 223 (2010).
Mak et al., Atomically Thin MoS2: A New Direct-Gap Semiconductor, PRL 105, 2010 The American Physical Society, pp. 136805-1 to 136805-4.
Yue et al., "Bandgap Tuning in Armchair MoS2 Nanoribbon", Journal of Physics: Condensed Matter, vol. 24, 2012 IOP Publishing Ltd. pp. 1-7.
Yun et al., Thickness and Strain Effects on Electronic Structures of Transition Metal Dichalcogenides: 2H-MX2 semiconductors (M=Mo, W; X = S, Se, Te), Physical Review B85, 2012 American Physical Society, pp. 03305-1 to 03305-5.
Pending U.S. Appl. No. 14/148,174, dated Jan. 16, 2014, entitled: "Method of Modeling Concentration of Reducible Mobile Ionic Dopant in Semiconductor Device Simulator".
IBM: List of IBM Patents or Patent Applications Treated as Related (Appendix P), Nov. 28, 2016 , 2 pages.
Pending U.S. Appl. No. 15/211,013 , entitled: "Tunable Voltage Margin Access Diodes", 15 pages.
Das et al., "High Performance Multilayer MoS2 Transistors with Scandium Contacts", Copyright © 2012 American Chemical Society, Publication Date (Web): Dec. 14, 2012, Nano Lett., 2013, 13 (1), pp. 100-105, Abstract, 2 pages.
Lewis et al., "Thin Films of Molybdenum Disulfide Doped with Chromium by Aerosol-Assisted Chemical Vapor Deposition (AACVD)", © 2015 American Chemical Society, Chem. Mater. 2015, 27, 1367-1374.
Ye et al., "Recent Advancement on the Optical Properties of Two-Dimensional Molybdenum Disulfide (MoS2) Thin Films", Open Access, Photonics 2015, 2, 288-307.

* cited by examiner

TUNABLE VOLTAGE MARGIN ACCESS DIODES

BACKGROUND

The present invention relates generally to high current density access devices, and more particularly, to a structure and method of forming tunable voltage margin access diodes using layers of mixed ionic-electronic conduction (MIEC) materials.

In order to increase the density of memory technologies (both volatile and nonvolatile), a crosspoint design is typically preferred. In such an optimized design, the wordlines and bitlines (hereafter referred to as memory lines) run at minimum pitch=2F, where F refers to the lithographic minimum feature size (for example, 32 nm), and storage elements are placed between these perpendicularly oriented memory lines at their crosspoints.

Two device components are needed at the crosspoint of the memory lines: (a) a memory element and (b) a rectifying diode or access device (AD). The memory element refers to an element that is used to store data/information. Many options exist here, including, for example, phase change memory (PCM), MRAM, Resistive RAM (RRAM), solid electrolyte memory, FeRAM, etc. The rectifying element or AD is needed because a transistor is usually not provided at every crosspoint, so a device is needed to rectify current (i.e., exhibit nonlinearity). This ensures that the memory cells that lie on unselected wordlines and bitlines are not inadvertently programmed or shorted to each other and do not leak any significant amount of current.

The quality of single-crystal silicon p-n and Schottky diodes that can be fabricated in middle-of-line (MOL) or back end of line (BEOL) lower temperature processes is typically very low since they have to be made in amorphous or polycrystalline silicon that has much lower mobility. This may prevent the use of p-n junctions in either single-crystal silicon or other silicon materials as rectifiers for high-current memory elements (especially in 3D applications).

Instead of using single-crystal silicon p-n and Schottky diodes as ADs at the crosspoint of the memory lines, solid electrolyte (SE) diodes may be used. The advantage of this approach is the high ON/OFF ratio, as the SE can provide very high currents in the ON state (since it has a metallic filament that bridges the two electrodes) and very low OFF currents. However, disadvantages with this approach include: the need for an explicit erase step to erase the filament, wherein such an erase step can be quite slow (for example, hundreds of microseconds are needed to erase a thick filament); the low reliability/endurance of the SE element during high current programming; and the very low OFF current actually being near or below a noise floor current in some devices.

SUMMARY

According to an embodiment, a method of forming an access diode having a tunable voltage margin is disclosed. The method may include: forming a mixed ionic-electronic conduction (MIEC) layer on a substrate, the MIEC layer including one or more individual layers of $MoS_2$; doping the MIEC layer with a conductive defect dopant; forming a first electrode on the MIEC layer; and forming a second electrode on the MIEC layer, the second electrode separated from the first electrode by a lateral portion of the MIEC layer.

According to another embodiment, a method of tuning a voltage margin of an access diode is disclosed. The method may include: adjusting a bandgap of the access diode by varying a number of layers of a mixed electronic-ionic conduction (MIEC) material used to electrically connect a first electrode and a second electrode; and adjusting defect energy and effective mass of the access diode by doping the MIEC material with a conductive defect dopant.

According to another embodiment, an access diode structure having a tunable voltage margin is disclosed. The structure may include: a mixed electronic-ionic conduction (MIEC) layer on a substrate, the MIEC layer including one or more individual layers of $MoS_2$; a conductive defect dopant in a lattice structure of the MIEC layer; a first electrode on the MIEC layer; and a second electrode on the MIEC layer, the second electrode separated from the first electrode by a lateral portion of the MIEC layer.

BRIEF DESCRIPTION OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
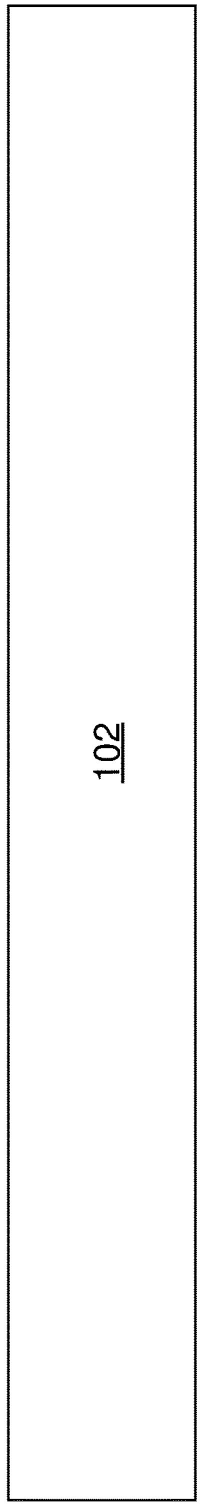
FIG. 1 is a cross section view of a structure, including a substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms “upper”, “lower”, “right”, “left”, “vertical”, “horizontal”, “top”, “bottom”, and derivatives thereof shall relate to the disclosed structures and methods, as oriented in the drawing figures. It will be understood that when an element such as a layer, region, or substrate is referred to as being “on”, “over”, “beneath”, “below”, or “under” another element, it may be present on or below the other element or intervening elements may also be present. In contrast, when an element is referred to as being “directly on”, “directly over”, "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to high current density access devices (ADs), and more particularly, to a structure and method of forming tunable voltage margin access diodes in phase change memory (PCM) blocks using layers of copper-containing mixed ionic-electronic conduction (MIEC) materials. A MIEC diode is a two terminal diode device containing a solid electrolyte (SE) material in which both electron/hole carriers and the activated dopant ion (e.g., Frenkel-pair defects) drift in an applied electric field and contribute to the total current. MIEC-based ADs may offer the large ON/OFF ratios, a high voltage margin $V_m$ (over which current <10 nA), and ultra-low leakage (<10 pA) needed to enable large arrays, as well as the high current densities needed for PCM and the fully bipolar operation needed for high-performance RRAM.

Embodiments of the present invention may use layers MIEC material to form an access device that can supply high current-densities and operate reliably while being fabricated at temperatures that are compatible with standard BEOL processing. By varying the deposition technique and amount of MIEC material used, the voltage margin (i.e. the voltage at which the device turns on and the current is above the noise floor) of the access device may be tuned to specific operating conditions of different memory devices. Methods by which to fabricate MIEC-based ADs having a tunable voltage margin are described in detail below with reference to FIGS. 1-4.

Referring now to FIG. 1, a cross section view of a structure 100 is shown. The structure 100 may include a substrate 102. The substrate 102 may be a bulk semiconductor substrate or a semiconductor on insulator (SOI) substrate. The substrate 102 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In a preferred embodiment, the substrate 102 may be composed of silicon. The substrate 102 may be approximately, but is not limited to, several hundred microns thick. In an embodiment, the substrate 102 may have a thickness ranging from approximately 0.5 mm to approximately 1.5 mm.

Figure 2:
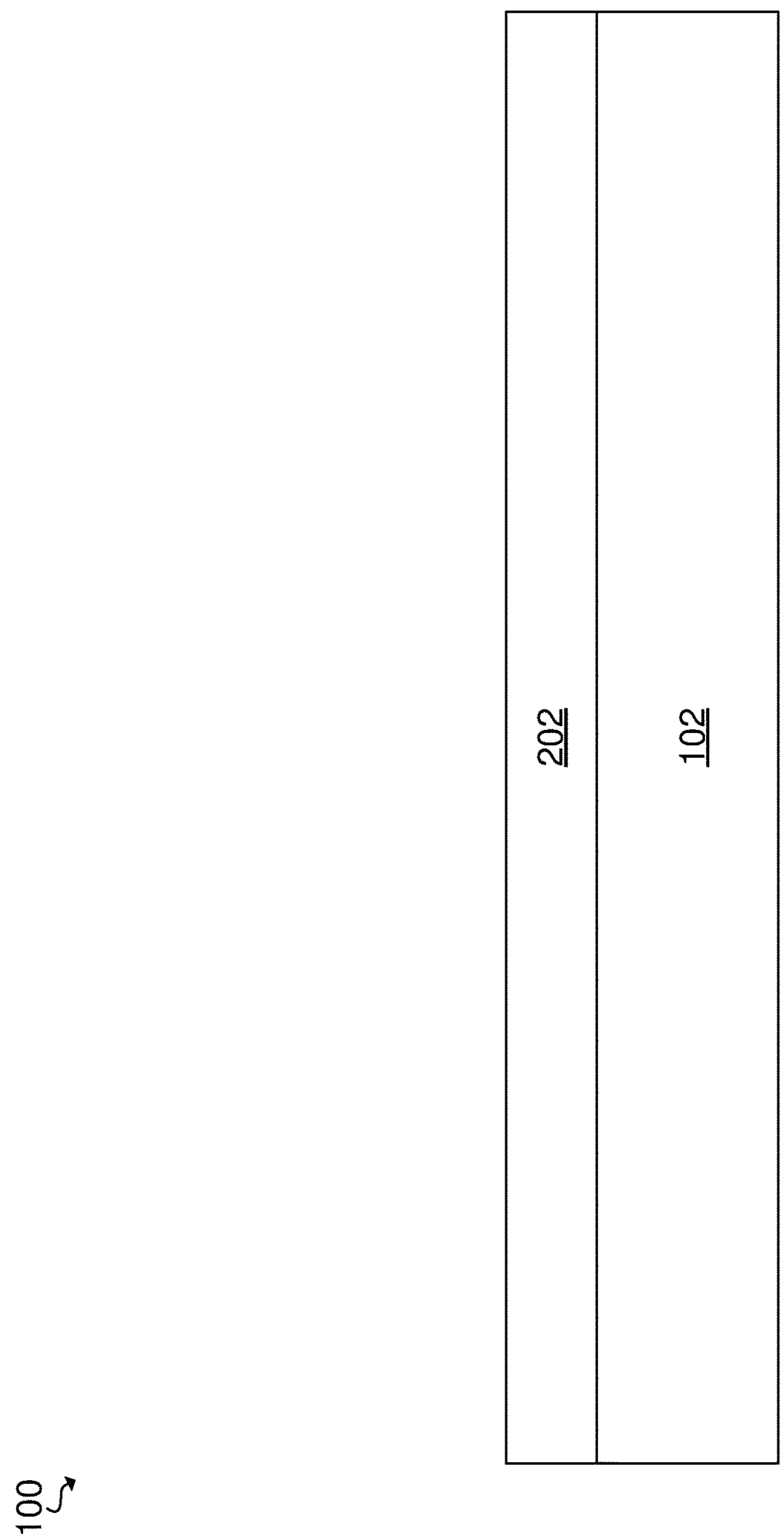
FIG. 2 is a cross section view illustration forming a MIEC layer on the substrate, according to an embodiment of the present invention.

Referring now to FIG. 2, a cross section view illustration forming a MIEC layer 202 on the substrate 102 is shown. In an embodiment, the MIEC layer 202 may be composed of molybdenum disulfide ($MoS_2$). $MoS_2$ is a semiconductor material made of layers that are weakly coupled by van der Waals forces. A layer is made of three atomic planes that are strongly bonded to each other: two hexagonal planes of sulfur atoms separated by one hexagonal plane of molybdenum atoms, with each molybdenum atom covalently bonded to six sulfur atoms in the adjacent planes. When present in layers, the sulfur atoms of one layer may be separated from the molybdenum atoms of an adjacent layer by approximately 3.46 angstroms. In an embodiment, the MIEC layer 202 may be doped with interstitial or substitutional defect atoms, such as copper (Cu) or chromium (Cr). The MIEC layer 202 may be doped with the defect atoms by conventional techniques, such as, for example, epitaxial doping, sputtering, vapor-phase epitaxy, chemical vapor deposition, diffusion, and ion implantation. In an embodiment, the defect atoms may be present in the MIEC layer 202 at a concentration ranging from approximately 1% to approximately 8%.

By varying the thickness and number of layers of $MoS_2$ in the MIEC layer 202, multiple parameters of the MIEC layer 202, such as bandgap (eV), defect energy (eV), voltage margin ($V_m$), and effective mass ($m_o$-hole), may be tuned based on the desired application. In an embodiment, the MIEC layer 202 may be composed of a single layer of $MoS_2$ doped with Cu. The single layer of $MoS_2$ may be formed using conventional deposition techniques, such as, for example, mechanical and chemical exfoliation, thin film sputtering, vapor-liquid-solid technique, molecular beam epitaxy, metal-organic chemical vapor deposition, or ion beam deposition. The single layer of $MoS_2$ may be doped with Cu using conventional deposition techniques, such as, for example, epitaxial doping, sputtering, vapor-phase-epitaxy, CVD, diffusion, or ion implantation. In an embodiment, the single layer of $MoS_2$ may have a thickness of approximately 6.5 angstroms.

In another embodiment, the MIEC layer 202 may be composed of two layers of $MoS_2$ doped with Cu arranged in a dual layer. In an embodiment, the sulfur atoms of one layer of $MoS_2$ may be separated from the copper atoms of the other layer of MoS2 by a distance of approximately 3.5 angstroms. This close proximity may result in physical interactions between the two layers of Cu doped $MoS_2$, resulting in the dual layer having different physical properties than the single layer of $MoS_2$, as illustrated below in Table 1. The two layers of $MoS_2$ may be formed using conventional deposition techniques, such as, for example, mechanical and chemical exfoliation, thin film sputtering, vapor-liquid-solid, molecular beam epitaxy, metal-organic chemical vapor deposition (MOCVD), or ion beam deposition. The two layers of $MoS_2$ may be doped with Cu using conventional doping techniques, such as, for example, epitaxial doping, sputtering, vapor-phase epitaxy, molecular beam epitaxy, CVD, MOCVD, diffusion, or ion implantation. In an embodiment, the two layers of $MoS_2$ may have a thickness ranging from approximately 1 nm to approximately 1.5 nm.

In another embodiment, the MIEC layer 202 may be composed of three or more layers of $MoS_2$ (i.e., bulk $MoS_2$) doped with Cu. The bulk $MoS_2$ may be formed using conventional deposition techniques, such as, for example, mechanical and chemical exfoliation, thin film sputtering, vapor-liquid-solid technique, molecular beam epitaxy, MOCVD, or ball milling. The bulk $MoS_2$ may be doped with Cu using conventional doping techniques, such as, for example, epitaxial doping, sputtering, vapor-phase epitaxy, molecular beam epitaxy, CVD, MOCVD, diffusion, or ion implantation. In an embodiment, the bulk $MoS_2$ may have a thickness ranging from approximately 10 nm to approximately 1 μm.

In another embodiment, the MIEC layer 202 may be composed of one or more ribbons of $MoS_2$ doped with Cu. In an embodiment, the ribbons may be formed by cutting or shaving one or more sacrificial layers of $MoS_2$ (typically 1-3 layers) into a strip of material having a finite narrow width. The cutting and/or shaving process may include conventional lithography techniques, such as, for example, electron-beam lithography or ion-beam lithography. In another embodiment, the ribbons of $MoS_2$ may be formed by the chemical unzipping of $MoS_2$ nanotubes. The ribbons of $MoS_2$ may be doped with Cu, either before or after the cutting, shaving, or unzipped processes, using epitaxial doping, sputtering, vapor-phase epitaxy, molecular beam epitaxy, CVD, MOCVD, diffusion, or ion implantation. The ribbons of $MoS_2$ may have a thickness ranging from approximately 6 angstroms to approximately 20 angstroms depending on whether the ribbon is made from a single layer $MoS_2$ or multiple layers $MoS_2$. The ribbons of $MoS_2$ may have a width ranging from approximately 1 nm to approximately 20 nm.

Figure 3:
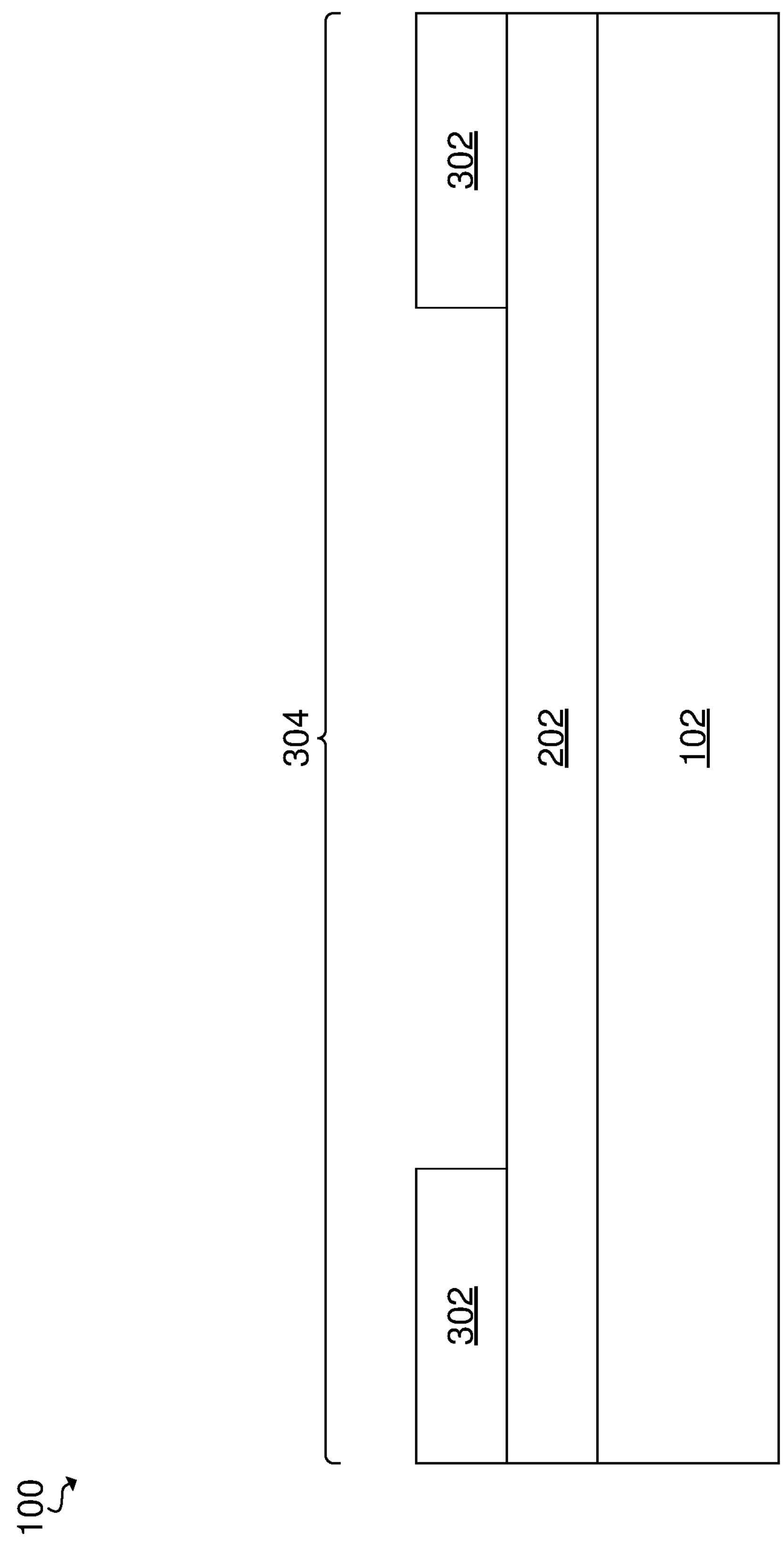
FIG. 3 is a cross section view illustrating forming one or more electrodes on the MIEC layer, according to an embodiment of the present invention.

Referring now to FIG. 3, a cross section view illustrating forming one or more electrodes 302 (hereinafter "electrodes") on the MIEC layer 202 is shown. The electrodes 302 may be composed of a conductive material. In an embodiment, the electrodes may be composed of a metal, such as, for example, Cu, W, Ti, Pt, Al, or alloys thereof. The electrodes 302 may be formed using a conventional deposition process, such as, for example, atomic layer deposition (ALD), chemical vapor deposition (CVD), physical vapor deposition (PVD), molecular beam deposition (MBD), pulsed laser deposition (PLD), liquid source misted chemical deposition (LSMCD), or plating.

In an embodiment, the one or more layers of $MoS_2$ in the MIEC layer 202 may extend vertically from an upper surface of the substrate 102. Current may flow horizontally between the electrodes 302 and through the MIEC layer 202, forming a MIEC diode 304. In an embodiment, the MIEC diode 304 may be used as an access diode in a Phase Change Memory (PCM) block.

Because of the variable thicknesses and composition of the MIEC layer 202, the voltage margin of the MIEC diode 304 may be tuned to fit specific needs. Voltage margin is defined as the range of voltage across the access device for which the current through it is always below 10 nA. For instance, if the current increases above 10 nA at $-|V_b|$ volts on the negative side and at $+|V_a|$ volts on the positive side of a curve that plots access device current versus voltage applied to the top electrode (with the bottom electrode grounded), then the voltage margin would be equal to $|V_a| \pm |V_b|$.

As shown in Table 1, the voltage margin can be varied significantly depending on the composition and thickness of the MIEC layer 202. The following data is based on an ab-initio simulation (i.e., a quantum mechanical parameter-free simulation using density functional theory (DFT) where many body interactions are taken into account to solve many-particle Schrodinger equations) of a MIEC diode 304 having various MIEC layers 202. The ab-initio simulation allows for the estimation of material properties of electronic structures, such as band gap, effective mass, thermal properties, magnetic properties, etc., as shown below.

TABLE 1

Material Properties of MIEC Diodes with Different MIEC Layers

| MIEC Layer ($MoS_2$—Cu) | Bandgap (eV) | Defect Energy (eV) | Voltage Margin ($V_m$) | Effective Mass ($m_o$-hole) |
|---|---|---|---|---|
| Single Layer | 1.8 | 0.8 | 1.28 | 0.82 |
| Two Layers | 1.4 | 1.15 | 0.84 | 0.85 |
| Bulk | 1.2 | 1.0 | 0.76 | 0.87 |

Figure 4:
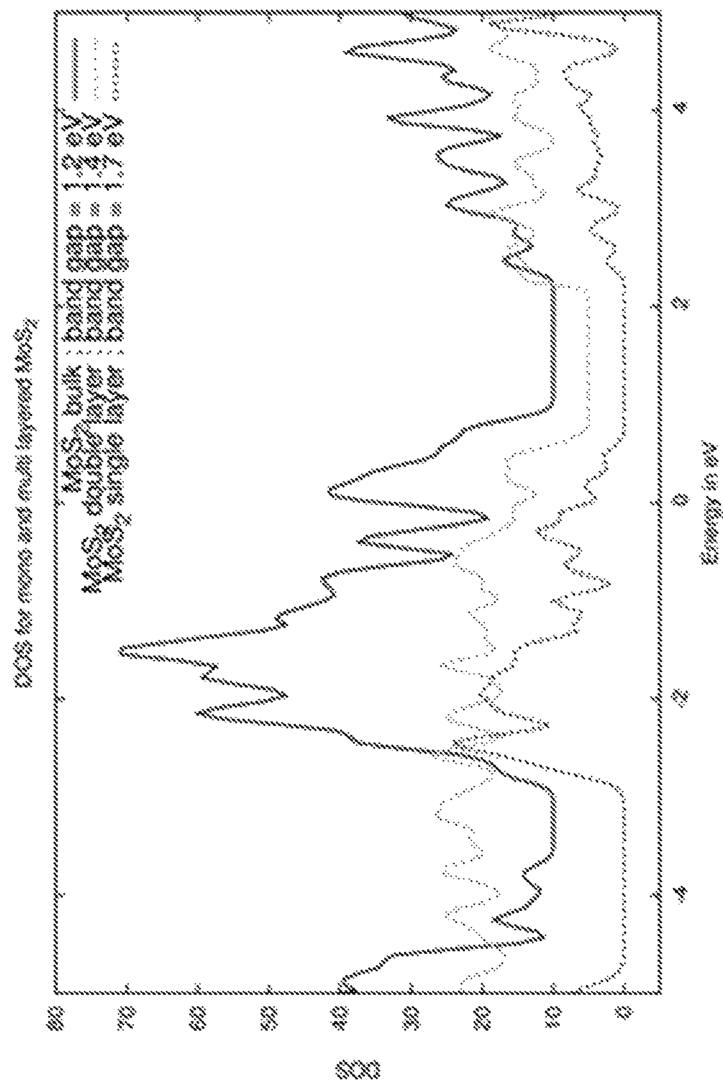
FIG. 4 is a graphical representation illustrating the density of states (DOS) and different bandgaps of the MIEC diode with different MIEC layers, according to embodiments of the present invention.

Referring now to FIG. 4, a graphical representation illustrating the density of states (DOS) and different bandgaps of the MIEC diode 304 with different MIEC layers 202 is shown. The graph shows the different DOS (i.e., the number of quantum states available per energy interval) at different energy levels of the MIEC diode 304. A high DOS at a specific energy level means that there are many states available for occupation. As shown in FIG. 4, the different MIEC layers 202, having different band gaps, result in different DOS at different energy levels, which can enable the tuning of the MIEC diode 304 based on desired parameters.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:

forming a mixed ionic-electronic conduction (MIEC) layer directly on a carbon doped silicon germanium substrate;

patterning the doped MIEC layer into multiple ribbons each having an approximate width of 1 nm;

forming a first titanium electrode at a first end of the ribbons, a bottom surface of the first titanium electrode is in direct contact with a top surface of the MIEC layer; and forming a second titanium electrode at a second end of the ribbons such that current flows horizontally from the first titanium electrode to the second titanium electrode and through the MIEC layer, a bottom surface of the second titanium electrode is in direct contact with a top surface of the MIEC layer.

* * * * *